United States Patent [19]
Alwais et al.

[11] Patent Number: 5,991,851
[45] Date of Patent: Nov. 23, 1999

[54] ENHANCED SIGNAL PROCESSING RANDOM ACCESS MEMORY DEVICE UTILIZING A DRAM MEMORY ARRAY INTEGRATED WITH AN ASSOCIATED SRAM CACHE AND INTERNAL REFRESH CONTROL

[75] Inventors: Michael Alwais; Kenneth J. Mobley, both of Colorado Springs, Colo.

[73] Assignee: Enhanced Memory Systems, Inc., Colorado Springs, Colo.

[21] Appl. No.: 08/850,802

[22] Filed: May 2, 1997

[51] Int. Cl.$^6$ .................................................. G06F 12/00
[52] U.S. Cl. ........................... 711/106; 711/105; 711/100
[58] Field of Search ................................... 711/106, 167, 711/105, 122, 118, 100, 128

[56] References Cited

U.S. PATENT DOCUMENTS

| | | | |
|---|---|---|---|
| 4,106,108 | 8/1978 | Cislaghi et al. | 365/222 |
| 4,625,301 | 11/1986 | Berger | 365/222 |
| 4,710,903 | 12/1987 | Hereth et al. | 365/194 |
| 5,226,147 | 7/1993 | Fujishima et al. | 395/425 |
| 5,239,639 | 8/1993 | Fischer et al. | 395/425 |
| 5,341,488 | 8/1994 | Kobayashi | 395/425 |
| 5,345,577 | 9/1994 | Chan et al. | 395/425 |
| 5,404,335 | 4/1995 | Tobita | 365/222 |
| 5,446,695 | 8/1995 | Douse et al. | 365/222 |
| 5,721,862 | 2/1998 | Sartore et al. | 395/445 |
| 5,745,913 | 4/1998 | Pattin et al. | 711/105 |
| 5,802,555 | 3/1997 | Shigeeda | 711/106 |
| 5,809,526 | 10/1996 | Patel | 711/122 |

OTHER PUBLICATIONS

John L. Hennessy & David A. Patterson, "Computer Architecture A Quantitative Approach", pp. 425–427, Dec. 1990.
"SRAM 64k×16 SRAM With Output Enable"©, MicroSemiconductor, Inc., 1993.
Memory Data Book, "Pseudo–Static RAMs–2" pp. 2–1–2–50©, 1993 Sharp Electronics Corp., P.O. Box 19086, Porland, OR 97280.

Primary Examiner—Eddie P. Chan
Assistant Examiner—Kimberly McLean
Attorney, Agent, or Firm—William J. Kubida, Esq.; Holland & Hart LLP

[57] ABSTRACT

An enhanced digital signal processing random access memory device utilizing a highly density DRAM core memory array integrated with an SRAM cache and internal refresh control functionality which may be provided in an integrated circuit package which is pin-compatible with industry standard SRAM memory devices. The memory device provides a high speed memory access device of particular utility in conjunction with DSP processors with performance equivalent to that of SRAM memory devices but requiring a significantly small die size which allows for the provision of greater effective memory capacity per die area. The internal refresh functionality of the device provides for all refresh operations to the DRAM memory array to occur transparently to the device user and provides control signals alerting the associated controller when refresh operations are being performed.

16 Claims, 10 Drawing Sheets

ENHANCED SIGNAL PROCESSING RANDOM ACCESS MEMORY DEVICE UTILIZING A DRAM MEMORY ARRAY INTEGRATED WITH AN ASSOCIATED SRAM CACHE AND INTERNAL REFRESH CONTROL

CROSS REFERENCE TO RELATED PATENT APPLICATIONS

The present invention is related to the subject matter of U.S. patent application Ser. No. 08/319,289 filed Oct. 6, 1994 and Ser. No. 08/460,665 filed Jun. 2, 1995, both assigned to Enhanced Memory Systems, Inc., a subsidiary of Ramtron International Corporation, Colorado Springs, Colo., assignee of the present invention, the disclosures of which are herein specifically incorporated by this reference.

BACKGROUND OF THE INVENTION

The present invention relates, in general, to the field of integrated circuit ("IC") memory devices. More particularly, the present invention relates to a highly integrated enhanced signal processing random access memory IC device which utilizes a dynamic random access memory ("DRAM") primary memory in conjunction with a static random access memory ("SRAM") cache and on-chip refresh control function which may be conveniently supplied in an industry standard SRAM IC pin-out.

Digital signal processing ("DSP") is a term applied variously to analog signal processing performed digitally or real-time signal processing as opposed to processing performed off-line. In either case, DSP is a highly computationally intensive form of signal processing in which many arithmetic operations must be performed very rapidly. As a consequence, the choice and configuration of DSP memory components for such high throughput processing gives rise to numerous unique considerations. Among these are that the individual memory devices, or "chips" which must be addressed by the DSP components must match the overall system speed or constitute a data processing "bottleneck".

This requirement has, in part, driven the demand for and development of high speed SRAM devices. However, because the memory cell configuration of an SRAM device requires a layout of either four or six transistors per cell, as opposed to the single transistor/single capacitor cell of most DRAMs, they are inherently more costly in terms of on-chip die area requirements and cannot provide the relatively greater integration densities of conventional DRAM devices. In an attempt to provide a trade-off between cost and speed, DSP system designers will often use a combination of SRAM and DRAM devices wherein the former is primarily utilized for program memory wherein device access time is among the throughput constraints and the latter may be used for data memory in those applications wherein data can be pipelined.

SUMMARY OF THE INVENTION

The present invention advantageously provides a memory device utilizing a high density DRAM core memory array integrated with an SRAM cache and internal refresh control functionality which may be provided in an integrated circuit package which is pin-compatible with industry standard SRAM memory devices. The memory device of the present invention provides a high speed memory access device of particular utility in conjunction with DSP processors with performance equivalent to that of SRAM memory devices but requiring a significantly small die size which allows for the provision of greater effective memory capacity per die area. The internal refresh functionality of the device provides for all refresh operations to the DRAM memory array to occur transparently to the device user and provides control signals alerting the associated controller when refresh operations are being performed.

Particularly disclosed herein is a refresh control technique for a memory device incorporating a DRAM memory array which comprises the steps of periodically refreshing the memory array if an external input to the memory device is in a first state thereof; delaying at least one type of access to the memory device during the step of periodically refreshing the memory array for a predetermined time period; and asserting a wait signal on an external output of the memory device in response to the step of delaying. In a more particular embodiment, the refresh control technique comprises the steps of suspending the step of periodically refreshing the memory array if the external input to the memory device is in a second opposite state thereof; maintaining suspension of the step of periodically refreshing the memory array until a predetermined number of refresh operations have been suspended; and performing a refresh operation to the memory array if the predetermined number of suspended refresh operations is reached.

Also disclosed herein is an integrated circuit memory device which comprises a dynamic random access memory array, a static random access memory cache coupled to the memory array for receiving a row of data therefrom and a memory decoder coupled to the memory array and the memory cache. An input/output control circuit is coupled to the memory array and the memory cache and an external address bus is coupled to the memory decoder for accessing the memory array and the memory cache. An external data bus is bidirectionally coupled to the input/output control circuit for receiving data to be written to the memory array at a location determined by the memory decoder and for providing data to be read from the memory cache and an external address valid strobe input is coupled to the memory decoder for indicating that an address signal on the external address bus is valid.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
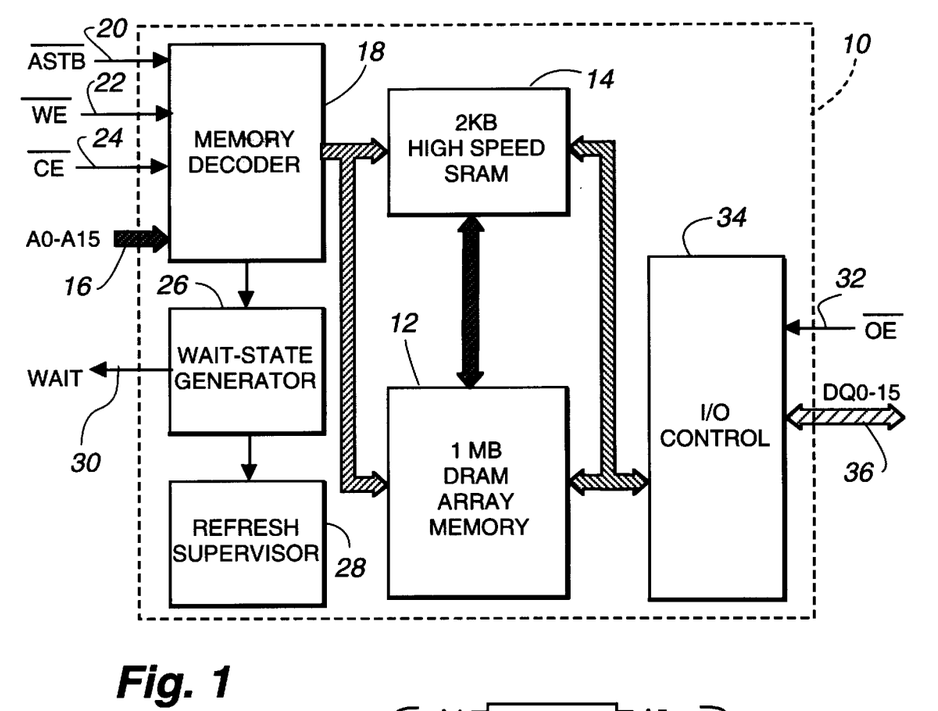
FIG. 1 is a functional block diagram of a representative enhanced signal processing RAM memory device in accordance with the present invention.

With reference now to FIG. 1, an integrated enhanced signal processing random access memory device 10 in accordance with the present invention is shown. The memory device 10 comprises, in pertinent part, a dynamic random access memory ("DRAM") array 12 comprising one or more banks of DRAM memory and an associated static random access memory ("SRAM") cache 14 also comprising one or more corresponding banks of SRAM memory.

The memory device 10 is accessed by means of a parallel address bus 16, which in the exemplary 1 Mb (64K×16) device illustrated, comprises sixteen address lines $A_0$ through $A_{15}$. The address bus 16 provides address signal inputs to the DRAM array 12 and the SRAM cache 14 through a memory decoder 18 which also has as inputs an address valid strobe input ("ASTB\") 20, a write enable input ("WE\") 22 and a chip enable input ("CE\") 24 as will be more fully described hereinafter.

A wait-state generator 26 is coupled to an additional output of the memory decoder 18 and provides a "Wait" output signal on output 30 of the memory device 10. An output enable input ("OE\") 32 is also supplied to the memory device 10 for input to an input/output ("I/O") control block 34 which is bidirectionally coupled via an internal data bus to the DRAM array 12 and the SRAM cache 14 such that data may be read from, or written to, the memory device 10 via a bidirectional data bus 36. In the embodiment illustrated, the data bus 36 comprises sixteen I/O pins denominated $DQ_0$ through $DQ_{15}$.

Figure 2:
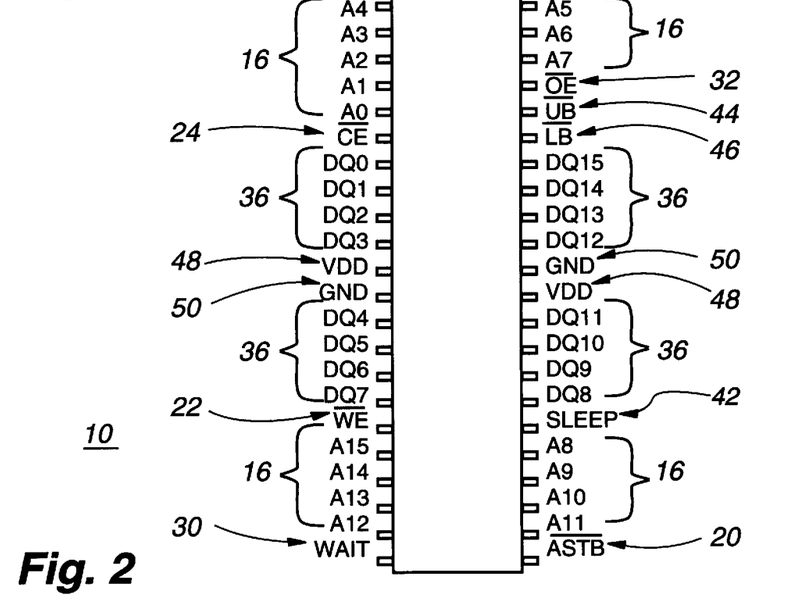
FIG. 2 is a representative pin-out for the memory device of FIG. 1 which is pin compatible with an industry standard SRAM pin-out.

With reference additionally now to FIG. 2, the memory device 10 of FIG. 1 is illustrated in an exemplary industry standard 64K×16 SRAM pin-out. The memory device 10 may be conveniently encapsulated in any pin-out or package configuration including a 44 pin TSOP or the SOJ package as shown. Any number of industry standard SRAM pin-outs (i.e. 20, 22, 24, 28, 32, 36, 44, 50, 52, 64, 68 and the like) in any type of package (i.e. DIP, ZIP, PLCC, PQFP, SOJ, TSOP, SOIC, SIMM and the like) may also be used. With respect to this figure, inputs, outputs and I/O pins above described with respect to FIG. 1 are like numbered and the foregoing description thereof shall suffice herefor. The memory device 10 is shown having additional pins corresponding to: a sleep input 42 which causes the memory device 10 to power down internally; an upper byte enable input ("UB\") 44 and lower byte enable input ("LB\") 46 which have equivalent functions as to the CE\ input 24 with respect to the upper and lower 8 bits of data on the data bus respectively; and power supply ("VDD") 48 and ground ("GND") 50 inputs to provide operating power to the memory device 10, all as will be more fully described hereinafter.

Figure 3:
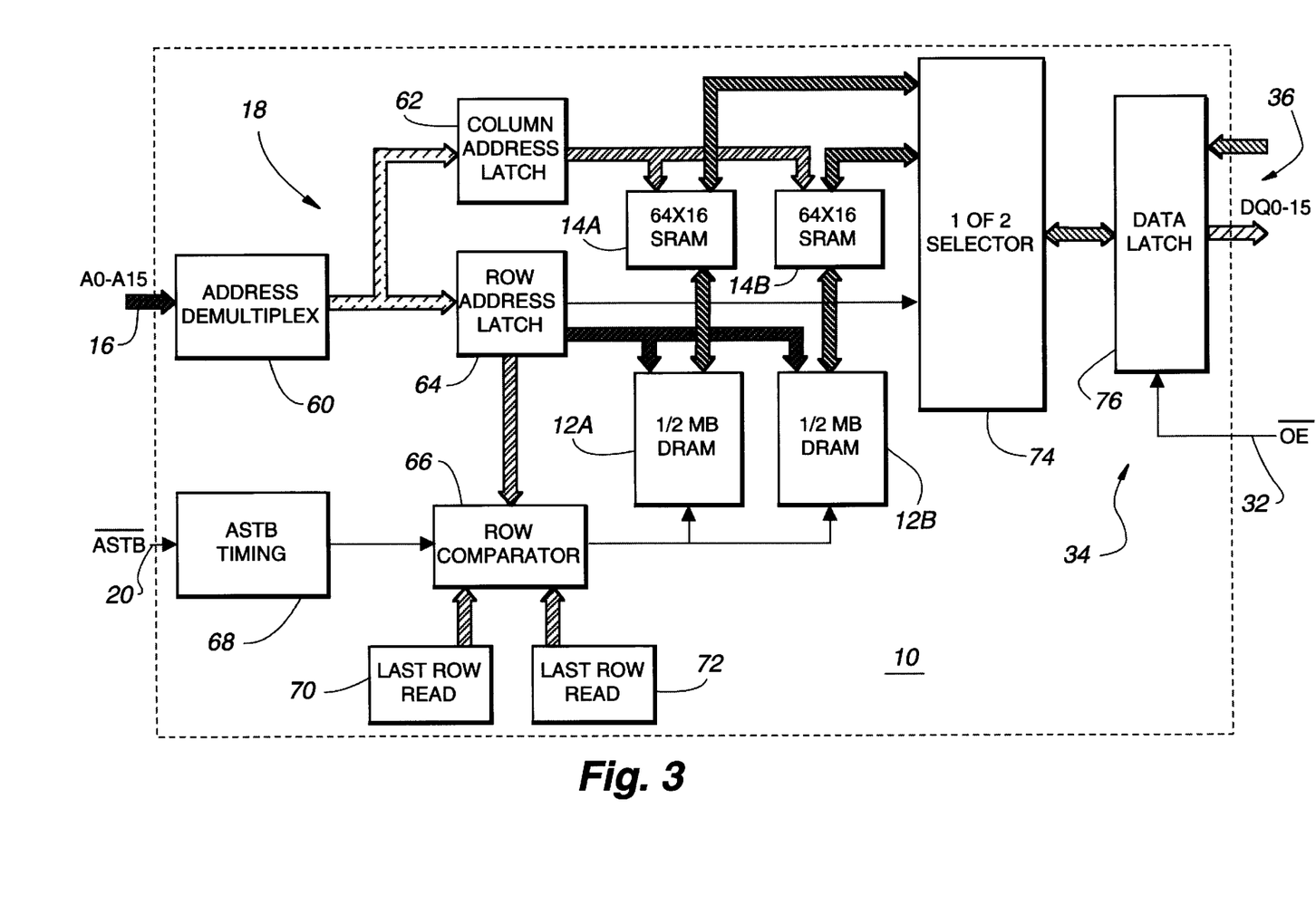
FIG. 3 is a more detailed functional block diagram of the memory device of FIGS. 1 and 2 illustrating, inter alia, the use of separate DRAM memory array banks and corresponding SRAM caches.

With reference additionally now to FIG. 3, a more detailed functional block diagram of the memory device 10 of the preceding figures is shown. Structure corresponding to that described with the preceding figures is like numbered and the foregoing description thereof shall suffice herefor. The memory device 10, which may comprise a monolithically integrated circuit in a preferred embodiment, may incorporate, as shown, two or more banks of DRAM memory comprising arrays 12A and 12B and two or more banks of SRAM memory comprising corresponding caches 14A and 14B.

In this more detailed illustration, the memory decoder 18 (FIG. 1) is shown as comprising an address demultiplexer 60 and separate column and row address latches 62 and 64 respectively. The address demultiplexer 60 and column and row address latches 62, 64 serve to derive the location within the DRAM array 12A and 12B wherein data is to be written, or from which data is to be read from the associated SRAM cache 14A and 14B as loaded from the DRAM array 12A and 12B as determined by the signals on the address bus 16.

A row comparator 66 is coupled to an output of the row address latch and to a pair of last row read registers 70, 72 (or any other number of registers corresponding to the number of banks of the DRAM array 12A and 12B and SRAM cache 14A and 14B). The last row read registers 70, 72 serve to maintain the row address of the data that is currently maintained within the SRAM memory comprising SRAM cache 14A and 14B.

If the address bus indicates an access is intended for data currently maintained within the corresponding SRAM cache 14A and 14B, (a cache "hit") and the operation is a "read" then the appropriate bank is selected by the 1 of 2 selector 74 under control of the row address latch 64 and latched into a data latch 76 for output on the data bus 36. Once the contents of the appropriate one of the SRAM caches 14A and 14B is read out, the associated DRAM array 12A and 12B then loads the next row to the SRAM cache 14. If the intended read access is a cache "miss" then the data is read out of the appropriate row of the DRAM array 12A and 12B to the SRAM cache 14A and 14B and all subsequent reads are then from the SRAM cache 14A and 14B. If the access is a write operation to a cache "hit", then the data on the data bus 36 is written both to the DRAM array 12A and 12B as well as to the SRAM cache 14A and 14B. If the access is a cache "miss", then data is written solely to the DRAM array 12A and 12B. In short, all reads are from the SRAM cache 14A and 14B and all writes are to the DRAM array 12A and 12B with a write-through to the SRAM cache 14A and 14B if a cache "hit" is indicated by the appropriate one of the last row read registers 70, 72.

The embodiment of the memory device 10 above described provides a cost effective 1 Mb pin compatible SRAM equivalent integrated circuit of particular utility in conjunction with DSP and other high performance systems and broadens the options for system designers who have previously used DRAM for low cost memory and expensive SRAM for high performance. The memory device 10 melds these separate technologies to create a cost effective memory with an effective 10 nS access time. It is of particular utility in solving the memory problems of high performance systems without regard to rigid memory classifications by combining an appropriate amount of different memory technologies and logic.

The memory device 10 provides a standard SRAM pin out with the unused pins allocated to address strobe and wait signals. The address strobe input allows an memory device 10 to interface with TMS320 (available from Texas Instruments, Inc., Dallas, Tex.) and other processors to provide optimal timing with a glueless interface. The wait signal indicates that the memory device 10 cannot provide zero wait state operation for high speed systems and is typically connected to the ready input of a processor.

As previously described, the memory device 10 provides a cost-effective high performance memory for digital signal processing and other high performance applications. It achieves these goals by using a fast DRAM array 12 (divided into one or more banks) as the bulk memory and dynamically allocating a very fast SRAM cache 14 (also divided into one or more cache lines) to the memory area that is being used.

The memory device 10 provides a non-multiplexed SRAM like addressing scheme. Since the core DRAM memory array 12 is constructed from DRAM, a random read operation will access the DRAM array 12. An entire DRAM row of 1K-bits will automatically be loaded into very fast SRAM cache. Subsequent accesses that fall within the 64-word address range of the DRAM row will be made in SRAM at high speed. These addresses are called in-page accesses. Addresses that are not in-page will cause a DRAM access and a new row will be loaded into SRAM. In-page accesses are performed in 10 nS for zero wait state operation and the wait signal on the wait output 30 is not asserted. Accesses that are out-of-page and cause a DRAM array 12 access will cause a wait state via the wait signal on the wait output 30 This scheme applies to reads and writes equally.

Based on the premise that data occurs primarily in blocks, the memory device 10 will perform most accesses in 10 nS. However, the actual performance level will depend on the application and the percentage of data that occurs in blocks. Since the core memory array is DRAM, it must be refreshed and on-chip logic supervises this function. If an out-of-page access occurs during a DRAM refresh operation, the wait signal on the wait output 30 will be asserted. Refresh logic is optimized to cause minimum delays by performing refreshes while in page accesses are being done.

Figure 4A:
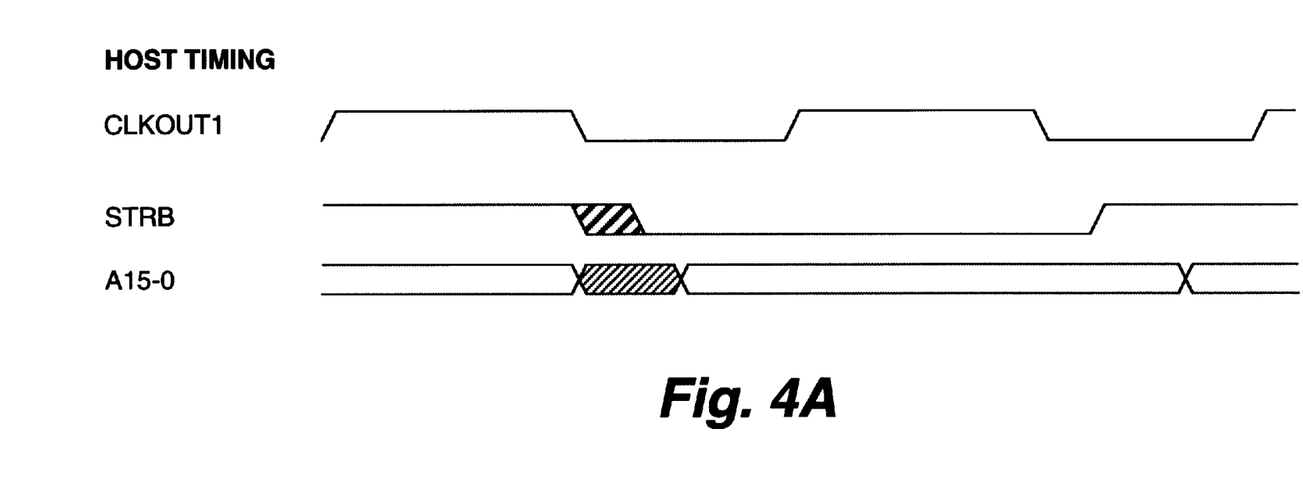
FIGS. 4A and 4B are representative timing signal diagrams for the host and internal timing respectively for a particular embodiment of memory device in accordance with the present invention utilizing an address valid strobe signal.
Figure 4B:
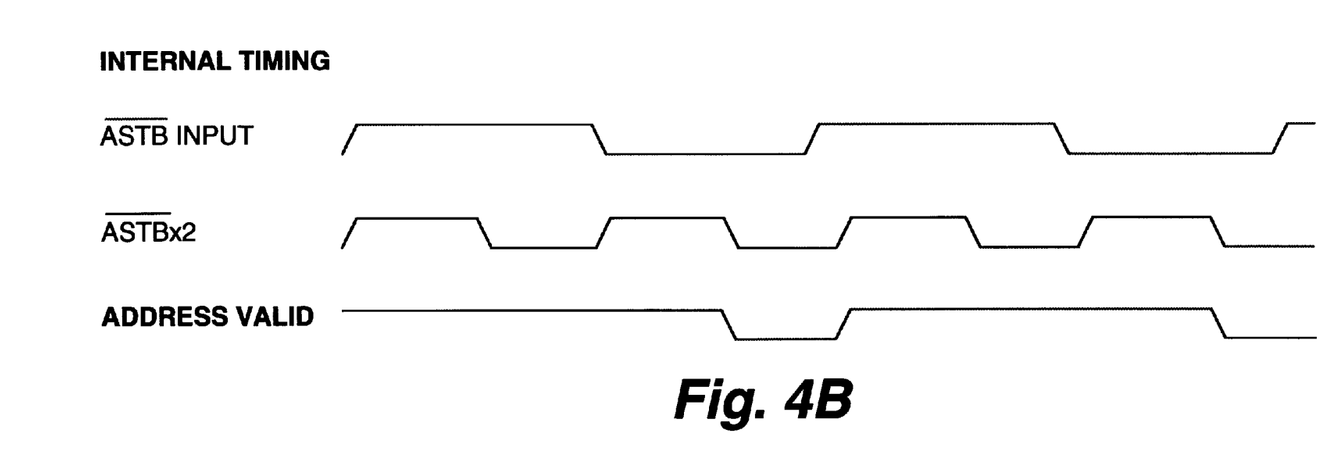

The block diagram of FIG. 3 illustrates the elements of a memory device 10.including the presence of 2 SRAM caches 14A and 14B. This scheme increases the likelihood of a random in-page access and also allows intelligent planning of SRAM access. With reference additionally now to FIGS. 4A and 4B, the address decoding operations for the memory device 10 of the preceding figures is shown. In many systems, memory is either fast (SRAM) or slow (DRAM), and the latter, slow memory inserts wait states all of the time. Fast memory never inserts wait states. When using the memory device 10, the memory dynamically changes between fast and slow based on the address. Moreover, the address map is not fixed, with fast memory in certain addresses and slow in others. In fact, the memory can be fast over almost the entire memory map. For this reason, proper address decoding is an important aspect in the function of the memory device 10. Combining mixed memory technologies in a seamless solution requires the memory to be aware of the address space and to manage access based on addresses.

The memory device 10 monitors addresses in order to determine if an access is required to the DRAM array 12 or the SRAM cache 14. Each address is broken into its constituent row and column portions and is latched internally. The lower 6 address lines AO-A5 of the address bus 16 are column addresses. They designate the location of the SRAM that is used and correspond to the DRAM array 12 columns. The upper 10 address lines A6-A 15 of the address bus 16 are row addresses. They designate the DRAM array 12 row that is accessed and loaded into the SRAM cache 14. Since the DRAM array 12 is split into 2 banks,(12A and 12B) the address A6 is also a DRAM bank select. Each DRAM bank (12A or 12B) has an associated SRAM cache (14A or 14B), so A6 selects which of the two 64×16 SRAM caches 14A or 14B are used.

Row addresses in each bank are compared against the last row read holding registers 70, 72 (one for each bank). If a row address, that is the upper 10-bits of address, is the same as the previous access, then the access is performed in the SRAM cache 14A or 14B at high speed. If the row address has changed, then the DRAM array 12A or 12B is accessed and loaded into the corresponding SRAM cache 14A or 14B.

The two banks of SRAM cache 14A and 14B can be combined to create one larger bank. Since the first access to a row causes that row to be loaded into SRAM cache 14, then if one access is performed with A6=0 and then an access is performed with A6=1, a contiguous bank of 128×16 of the SRAM cache 14 will exist using AO-A6 addresses. This creates a high speed working space for DSP applications.

Unlike a standard SRAM device, the address is latched and processed. In order to provide fast access, the memory must know that the address is valid. The ASTB\ address strobe input 20 signal provides this information. In order to provide a minimal logic solution, two exemplary embodiments of the memory device 10 are contemplated and shown.

In a first embodiment with relevant timing shown in FIG. 4A, the host processor does not generate an address valid strobe. In this case, the ASTB\ input 20 signal comes from a processor clock. Since addresses are valid after the clock edge, the signal is delayed internally in proportion to the clock frequency. This version interfaces directly to the TMS320C3X and TMS320C5X series DSPs available from Texas Instruments, Inc.

In the other version, the operation of which is shown in FIG. 4B, a true address valid signal is provided by the processor or system to the ASTB\ input 20 and is used by the memory device 10 without delay, and the figure illustrates the usage of the address valid strobe.

Figure 5:
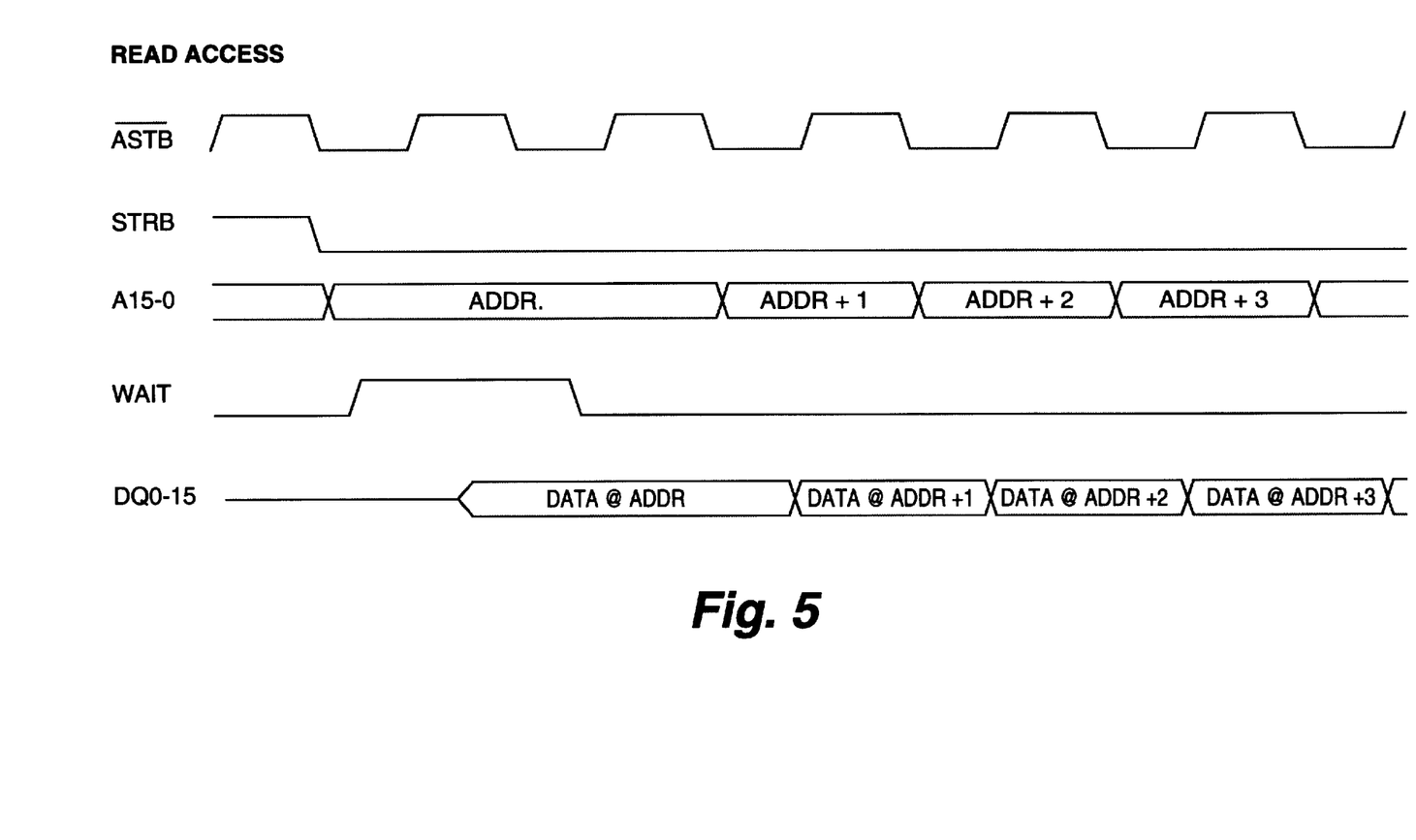
FIG. 5 is a representative timing signal diagram illustrating read accesses for both out-of-page and in-page access in conjunction with particular digital signal processing ("DSP") host processors.

With reference additionally now to FIG. 5, an exemplary read access operation is shown. As stated previously, the memory device 10 provides in-page access time at 10 nS. However, the actual system timing for each memory cycle depends on the type of cycle. There are four basic types of cycles as shown in the following Table 1. The timing of each also depends on the cycle that preceded it.

The first criteria is whether the access is in-page or out-of-page. An in-page access is one where the current row address (A6-A 15) corresponds to the last row read (in one of two banks of SRAM cache 14A or 14B). This means that the memory is available in SRAM for high speed access. In general, in-page access is associated with zero wait state operation and out-of-page access requires wait states. The second criteria is whether the access is a read or a write.

Based on representative DSP applications the memory timing is optimized for in-page access where data occurs in blocks. The timing of each operation is described hereinafter.

For an in-page read operation, address lines A6-A 15 are compared to the last row read register(s) 70, 72. If they match, then the requested address currently resides in the SRAM cache 14A or 14B regardless of the state of A5-AO. This is called an in-page access. Read accesses to in-page addresses can be performed in 10 nS. Since a single page contains 64 words, it is possible to perform as many as 64 consecutive reads, each in 10 nS once the row is loaded.

In an out-of-page read operation, each time the system generates a random read access with a new row address (the upper 10-bits of address), an out-of-page read is performed. The out-of-page read involves an access to the DRAM array 12A and 12B. The entire row is loaded into the corresponding SRAM cache 14A or 14B. Since the DRAM array 12 is accessed, the first access requires extra time. Therefore, the wait signal on the wait output 30 will be asserted until the data has been loaded into the SRAM cache 14 and high speed access is available. The number of waits generated by this activity depends on the actual processor bus speed.

In a typical scenario, the system performs one out-of-page read followed by seven in-page reads. A page may be though of as a 64-word high speed working area.

FIG. 3 illustrates read access for both out-of-page and in-page accesses using a TMS320C3x or TMS320C5x host processor. Detailed timing is described and shown in more detail hereinafter.

With in-page write operations, as with reads, an access occurs when the upper 10 address lines are the same as the previous access. Since the memory device 10 is optimized for in-page access, the in-page write occurs in 10 nS. Both the SRAM cache 14 and the DRAM array 12 are written using the same cycle. In this way, read-modify-write operations are accommodated.

Like an out-of-page read, the write operation requires opening the DRAM page. This operation requires longer than accessing an open array. Therefore, the write access will cause the wait signal to be invoked on the wait output 30.

The timing relationships have been described above are in general terms, and the four types of cycles described above have different access times and cycle times. More importantly, some types of cycles can occur during others. For example, in-page reads can occur during an out-of-page read cycle. While an out-of-page read may have a 50 nS cycle time, a new in-page read may be performed 30 nS into the out-of-page cycle. Thus in order to understand access times, the previous cycle should be considered.

Table 1 illustrates the system timing for various combinations. Note that the timings notations assume a 10 nS access and cycle times are standard. Thus when the table specifies 3 cycles, this means 30 nS which may be only one bus cycle for a given processor. Certainly if a system is running slower than 10 nS, the number of wait states will be lower.

TABLE 1

| Current Cycle ↓ | Read In-page | Read Out-of-page | Write In-page | Write Out-of-page | STANDBY |
|---|---|---|---|---|---|
| Read In-page | 1 | 1 | 1 | 1 | 1 |
| Read Out-of-page | 3* | 5 | 6 | 1 | 3 |
| Write In-page | 3*/4◊ | 5/6◊ | 1 | 1 | 3/4◊ |
| Write Out-of-page | 3* | 5 | 6 | 6 | 3 |

*Indicates that timing assumes 2 consecutive in-pages accesses have occurred prior to the out-of-page access. If only one has occurred, the 3 becomes a 4.
◊Indicates that timing varies with early/late write signals respectively. If a late-write occurs, extra time is required to detect the write cycle if the previous cycle was not a write.

\* Indicates that timing assumes 2 consecutive in-pages accesses have occurred prior to the out-of-page access. If only one has occurred, the 3 becomes a 4.

◊ Indicates that timing varies with early/late write signals respectively. If a late-write occurs, extra time is required to detect the write cycle if the previous cycle was not a write.

Wait states are a result of the DRAM array 12 timing. In general, SRAM cache 14 accesses occur in one cycle. 3 cycle accesses occur when the DRAM array 12 must be opened, where it was already closed. 5 cycle accesses occur when a DRAM page must be closed prior to opening a new DRAM page. A 6 cycle access can occur because a DRAM page is held open in-case of back-to-back write operations. This achieves 1-cycle access for in-page writes following writes.

All DRAM array 12 aspects are transparent to the user. They will simply result in wait-states being generated to accommodate different address sequences and it should be noted that the number of cycles indicated reflects 10 nS cycles. A slower processor would receive less wait states.

In order to illustrate the flow of timing, the following access sequences of Table 2 show the impact of preceding cycles on following cycles.

TABLE 2

| S | RM | RH | RH | RH | RM | RM | RH | RH | RM | RH | RM |   |
|---|---|---|---|---|---|---|---|---|---|---|---|---|
| — | 3 | 1 | 1 | 1 | 3 | 5 | 1 | 1 | 3 | 1 | 4 |   |
| S | WM | WH | WH | WH | WM | WM | WH | WH | WM | WH | WM |   |
| — | 3 | 1 | 1 | 1 | 6 | 6 | 1 | 1 | 6 | 1 | 6 |   |
| S | RH | WH | RM | WM | RH | WM | RM | WH | RH | WH | WH | RM |
| — | 1 | 3 | 6 | 5 | 1 | 3 | 6 | 5 | 1 | 3 | 1 | 6 |

*Note S = Standby, RH = Read in-page, RM = Read out-of-page, WH = Write in-page, and WM = Write out-of-page Like any DRAM memory device, the 1 Mb DRAM array 12 must be refreshed, and the memory device 10 supervises its own refresh activity. By understanding the refresh controller, these refreshes can be hidden so that they do not impact access time. The logic flow chart of FIG. 6 illustrates the algorithm used by the refresh controller.

Figure 6:
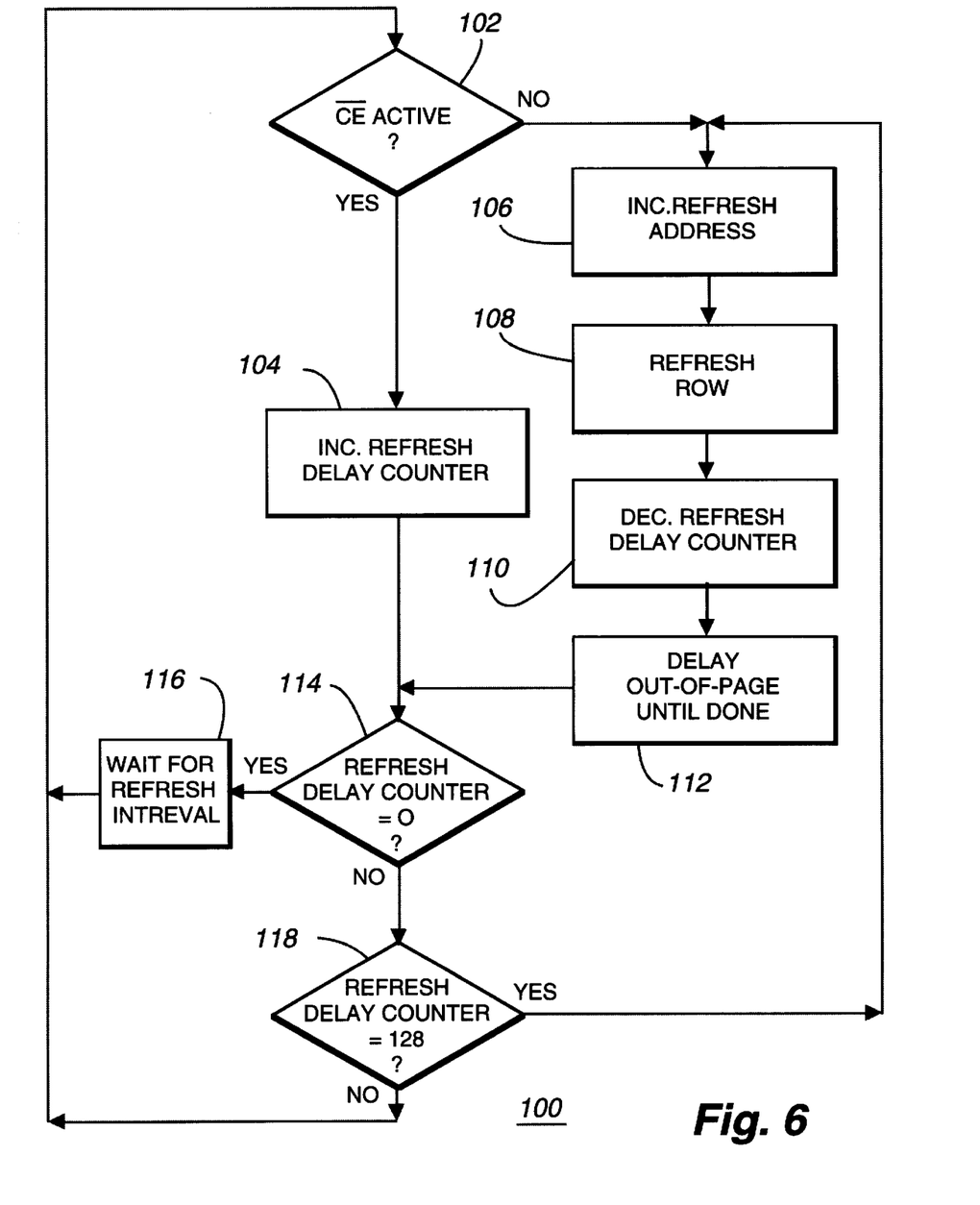
FIG. 6 is a logic flowchart illustrating the algorithm utilized by the refresh controller of a memory device in accordance with the present invention which allows refreshes to the DRAM array to be effectively "hidden" so as not to impact overall device access time.

With reference now to FIG. 6, the refresh process 100 begins with decision step 102 to determine if the CE\ input 24 to the memory device 10 is active. If it is, then the internal refresh delay counter is incremented. If the CE\ signal has not been asserted, the process 100 proceeds to step 106 to increment the refresh address and then to step 108 to refresh the appropriate row in the DRAM array 12. Thereafter, at step 110 the refresh delay counter is decremented and any out-of-page operation is delayed until it is completed at step 112.

From either step 104 or step 112, the process 100 proceeds to decision step 114 to determine if the refresh delay counter is zero. If it is, then at step 116 a wait is entered for a refresh interval and the process returns back to decision step 102. On the other hand, if the refresh delay counter is not zero, then, at decision step 118 the refresh delay counter is tested to see if it is equal to 128. If it is, then the process returns to step 106. Otherwise, it returns to decision step 102.

In operation, approximately every 125 uS, the refresh controller will attempt to perform a refresh. If the memory device 10 is not busy, i.e. CE\ is inactive, the refresh will occur. After its beginning, a refresh causes a 55 nS delay in the memory device's ability to perform an out-of-page access. An in-page read access will occur without delay. If an out-of-page access is attempted while a refresh is ongoing, the wait signal will be asserted on the wait output 30.

It is possible to avoid the refresh delay during critical operations. In fact, this occurs automatically if the CE\ input signal is held active. In this case, the refreshes will be held pending until either CE\ is returned to an inactive state or until 128 refreshes have been missed. In this case, a minimum of one refresh will be performed with the resulting delay. If more than 128 refreshes have been missed, the controller will attempt to perform enough to catch up.

The refresh controller is designed to accommodate two schemes. First is a system that maintains a continuous level of activity that can afford a 55 nS delay every 125 uS. In this case, one access will cause an extra 1–2 wait states every 125 uS. Most systems can afford this delay.

Figure 7A:
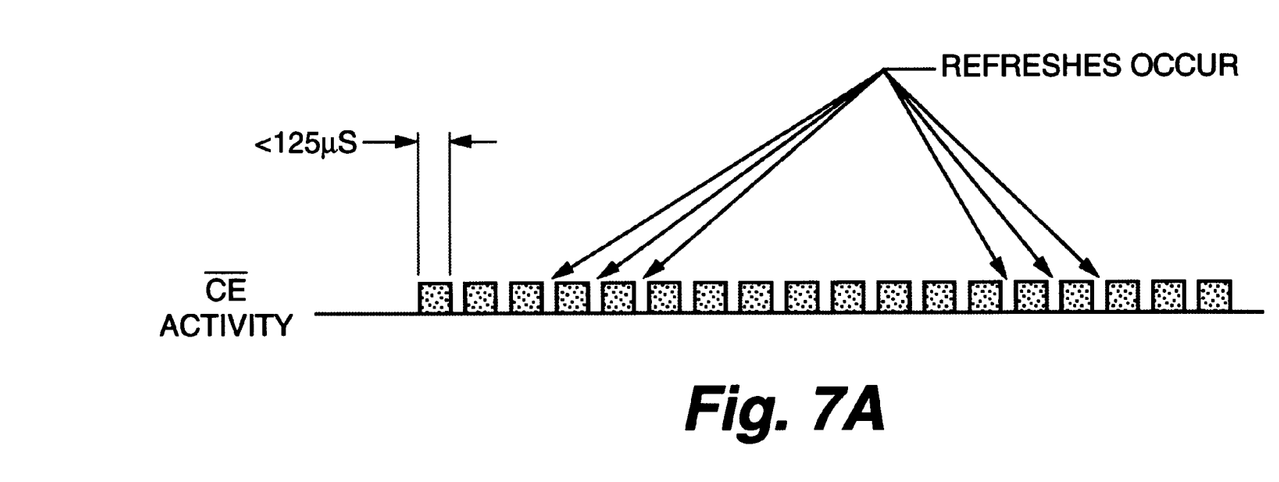
FIGS. 7A and 7B are representative refresh schemes for a memory device in accordance with the present invention illustrating chip enable ("CE\") and when refresh operations occur for the longest sequential delay of 128 uS or 7 uS following a user invoked delay of 16 uS respectively.
Figure 7B:
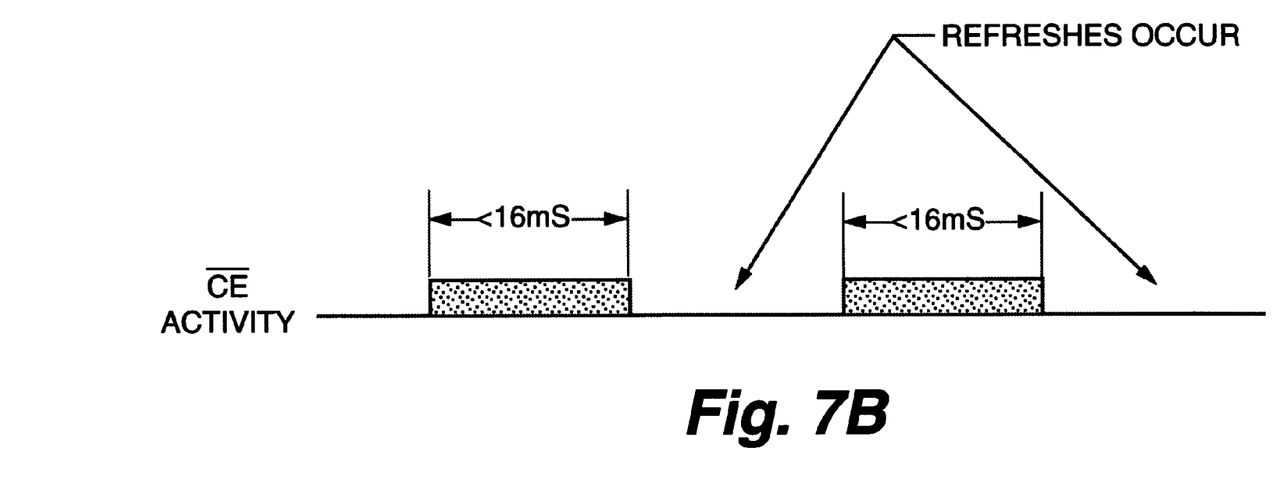

Second is a system with bursts of high intensity activity that can not be interrupted followed by longer periods of STANDBY time. In this case. the user prevents delays by holding the CE\ signal active during periods that can not be delayed. Many processors do this automatically. While CE\ is active, a refresh will not be performed until 128 have been missed, which takes 16 mS. In the event that the refresh limit is reached, the memory device 10 will begin to perform refreshes. The longest sequential delay will be 128 refreshes or 7 uS after a user invoked delay of 16 mS. These two scenarios are illustrated in FIGS. 7A and 7B respectively.

When the CE\ signal is not active, the memory device 10 is in a STANDBY state. As shown in Table 1 above, from a timing perspective, a STANDBY cycle is the same as an in-page read cycle. This is because the DRAM array 12 will be closed and the precharge delay satisfied. A STANDBY condition corresponds to standby in an SRAM device except that distributed refreshes will occur. These cause active-current spikes approximately every 125 uS but a low average power consumption will be achieved.

The memory device 10 also incorporates a SLEEP mode pin 42. It is located on an unused pin in the standard SRAM pin configuration. The SLEEP signal indicates that a long period of STANDBY time is expected. SLEEP powers down the memory device 10, including refresh, allowing a very low current with no spikes. SLEEP mode will not provide data retention so it may be used when the data in memory is no longer needed after the SLEEP mode is removed.

The following pin and signal descriptions are useful in understanding the operation of the memory device 10.

CE\—Chip Enable Input

Active low signal that indicates that the memory is being activated. When low, address comparisons will be made and refreshes will be avoided. When CE\ is high, addresses will be ignored and refreshes will be performed in a distributed fashion. Users that ground CE\ (like an SRAM) should consider the refresh implication of this decision.

WE\—Write Enable Input

Active low signal that indicates the memory cycle is a write operation. An early write, which offers more favorable timing will occur when WE\ is asserted prior to CE\. A late write, which occurs when WE\ falls after CE\ is acceptable.

WAIT—Wait Output

This signal indicates that the memory cannot provide high speed access for the requested memory cycle. It will be driven high until the memory can provide such high speed access.

ASTB\—Address Valid Strobe Input (Example 1)

This signal indicates that the address is valid. In version 1, the ASTB is expected to be derived from a processor clock, where the falling edges occur prior to a valid address. Internally, the ASTB input is delayed by ¼ of a duty cycle prior to latching the address.

ASTB—Address Valid Strobe (Example 2)

A rising edge on this signal indicates that the address is valid. No delay is applied, not that the polarity is reversed.

SLEEP—Sleep Mode Input

This active high signal causes the DM2104 to power down internally. No data retention is guaranteed so this mode is best used when a task is complete and the memory will not be used for an extended period. SLEEP mode produces much lower power consumption than standby mode.

OE\—Output Enable Input

Active low signal that indicates that the memory should drive the data bus. When OE\ is high, the data bus is tristate.

UB\—Upper Byte Enable Input

UB\ has an equivalent function to CE\ except only as regards the upper 8-bits of the data bus. UB\ must be low in order to access the upper byte of the data bus.

LB\—Lower Byte Enable Input

LB\ has an equivalent function to CE\ except only as regards the lower 8.bits of the data bus. LB\ must be low in order to access the upper byte of the data bus.

A15-0—Address Inputs

A 15-A6 specify the memory row, with A6 being a bank select. A5-AO specify the column and SRAM location.

DQ15-0 Data I/O

Bi-directional data bus.

VDD—Power Supply Input

+5V or +3V supply depending on the version.

VSS—Ground Input

Figure 8A:
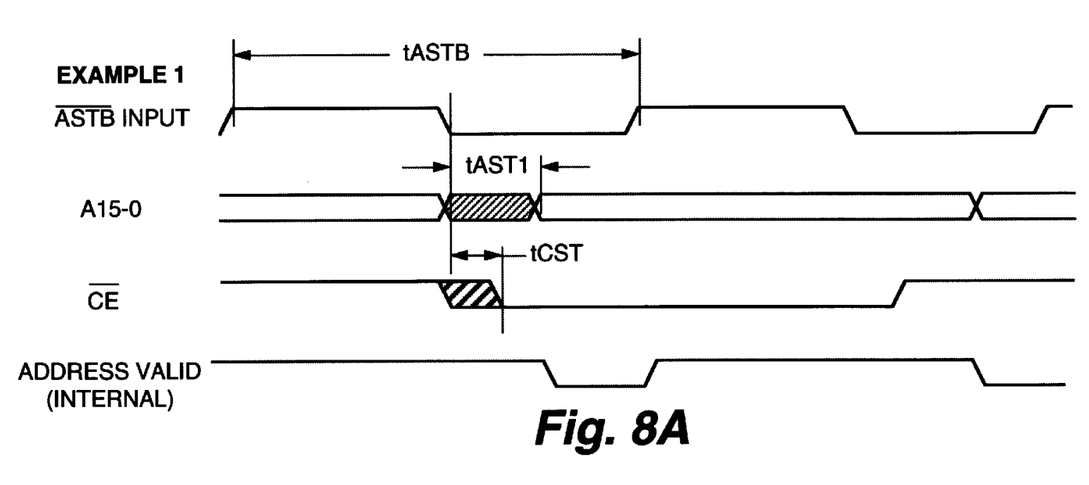
FIGS. 8A and 8B are representative timing signal diagrams for alternative exemplary implementations of the memory device of the present invention illustrating the address valid strobe ("ASTB\") input cycle time ("$t_{ASTB}$") and address setup times to ASTB falling ("$t_{AST1}$" and "$t_{AST2}$") in relationship to the chip enable ("CE\") to ASTB\ falling time ("$t_{CST}$")
Figure 8B:
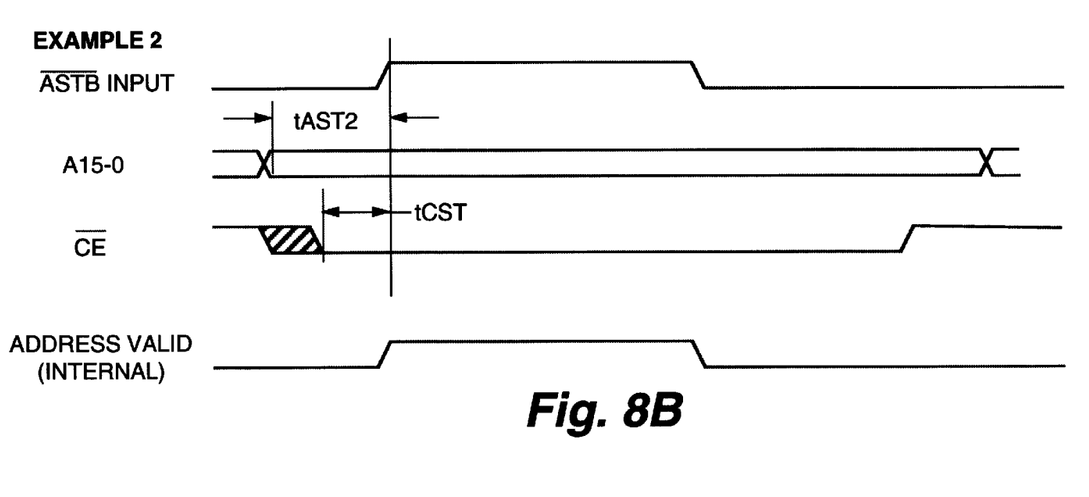

With reference additionally now to FIGS. 8A and 8B, ASTB timing diagrams are shown for two possible implementations of the memory device 10 of the present invention showing the interrelationship among the ASTB\ input 20, address bus 16 and CE\ input 24. A detailed explanation of the time symbols utilized in these figures is contained in the following Table 3 (AC Read Parameters) and Table 4 (AC Write Parameters):

TABLE 3

AC Read Parameters

| Symbol | Parameter | MIN | MAX | Units | Notes |
|---|---|---|---|---|---|
| $t_{ARA1}$ | In-page Access from Address Valid | | 10 | ns | |
| $t_{ARA0}$ | Out-of-Page Access from Address Valid | | 30 | nS | |
| $t_{RC1}$ | In-page Read Cycle Time | | 10 | nS | |
| $t_{RC0}$ | Out-of-page Read Cycle Time | | 50 | ns | |
| $t_{AST1}$ | Address Setup to ASTB falling (Example 1) | −¼ | | $t_{ASTB}$ cycle | *1 |
| $t_{AST2}$ | Address Setup to ASTB falling (Example 2) | 0 | | nS | *2 |
| $t_{CST}$ | CE Setup to ASTB falling | 0 | | | |
| $t_{ASTB}$ | ASTB cycle time | 25 | | nS | |
| $t_{CA}$ | Access time from CE, UB, LB | | 10 | | |
| $t_{COE}$ | Output Enable from CE | | 5 | nS | |
| $t_{OE}$ | Output Enable from OE | | 5 | nS | |
| $t_{COD}$ | Output Disable from CE, UB, LB | 0 | 10 | nS | |
| $t_{OD}$ | Output Disable from OE | 0 | 10 | nS | |
| $t_{WAIT}$ | Address Valid to WAIT Output | | 5 | nS | |
| $t_{SLAS}$ | SLEEP Low to Memory Available | 10 | | uS | |

TA = −40° C. to +85° C.,
VCC = 4.5 V to 5.5 V,
C1 = 50 pF
Notes
1. In-page read cycles may occur after the out-of-page read access time has been satisfied without regard to the out-of-page cycle time. Other cycles must satisfy the read cycle time prior to beginning.
2. For Example 1, the ASTB is assumed periodic. The Address is expected after the ASTB falling edge, but no later than ¼ clock cycle.

The following Table 4 describes the AC write parameters for the memory device 10.

TABLE 4

AC Write Parameters

| Symbol | Parameter | MIN | MAX | Units | Notes |
|---|---|---|---|---|---|
| $t_{AWA1}$ | In-page Write Access from Address Valid | | 10 | ns | |
| $t_{AWA0}$ | Out-of-Page Write Access from Address Valid | | 30 | nS | |
| $t_{WC1}$ | In-page Write Cycle Time | | 60 | nS | *1, 2 |
| $t_{WC0}$ | Out-of-page Write Cycle Time | | 60 | nS | *3, 4 |
| $t_{WP}$ | Write Pulse Width | 7 | | nS | |
| $t_{CW}$ | CE, UB, LB to end of Write | 9 | | nS | |
| $t_{DS}$ | Data Setup to WE Rising | 5 | | nS | |
| $t_{DH}$ | Data Hold from WE Rising | 0 | | nS | |
| $t_{OEW}$ | Output Enable from WE | 1 | | nS | |
| $t_{ODW}$ | Output Disable from WE | | 6 | nS | |

TA = −40° C. to +85° C.,
VCC = 4.5 V to 5.5 V,
C1 = 50 pF
Notes
1. In-page write cycles that occur following reads may be posted in 10 nS (access time) must the following cycle must delay until the Write Cycle time is satisfied. In-page writes that occur following other write operations occur in 10 nS but one write cycle time must be met prior to beginning a read or an out-of-page write.
2. An early write indication (WE before ASTB) will change this specification to 50 nS.
3. In-page write or read cycles may occur after the out-of-page write access time has been satisfied without regard to the out-of-page cycle time. Other cycles must satisfy the write cycle time prior to beginning.
4. An early write indication (WE before ASTB) will change this specification to 50 nS.

Figure 9A:
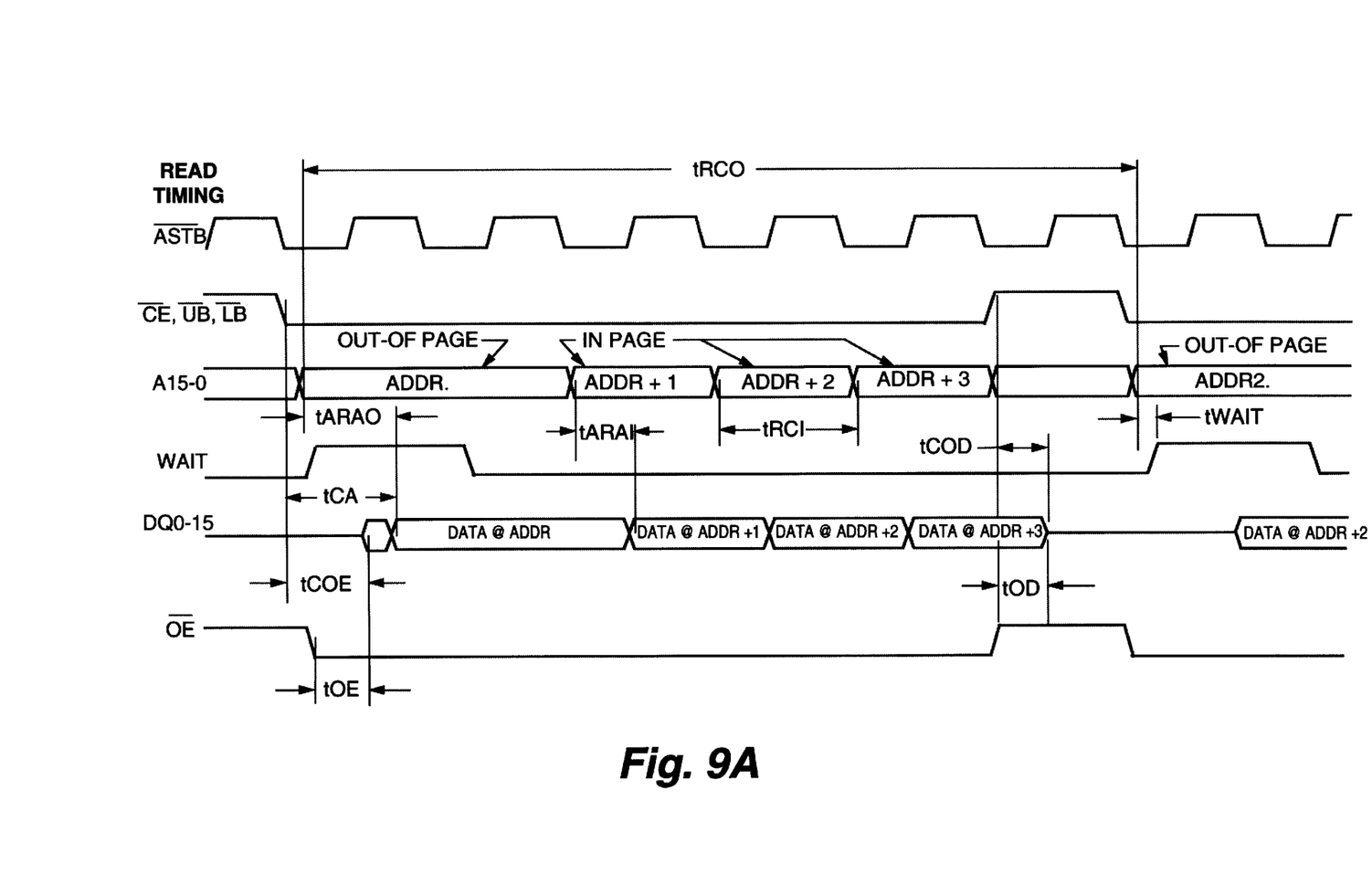
FIGS. 9A, 9B and 9C are representative timing signal diagrams for read, write and sleep timing respectively of a possible implementation of a memory device in accordance with the present invention.
Figure 9B:
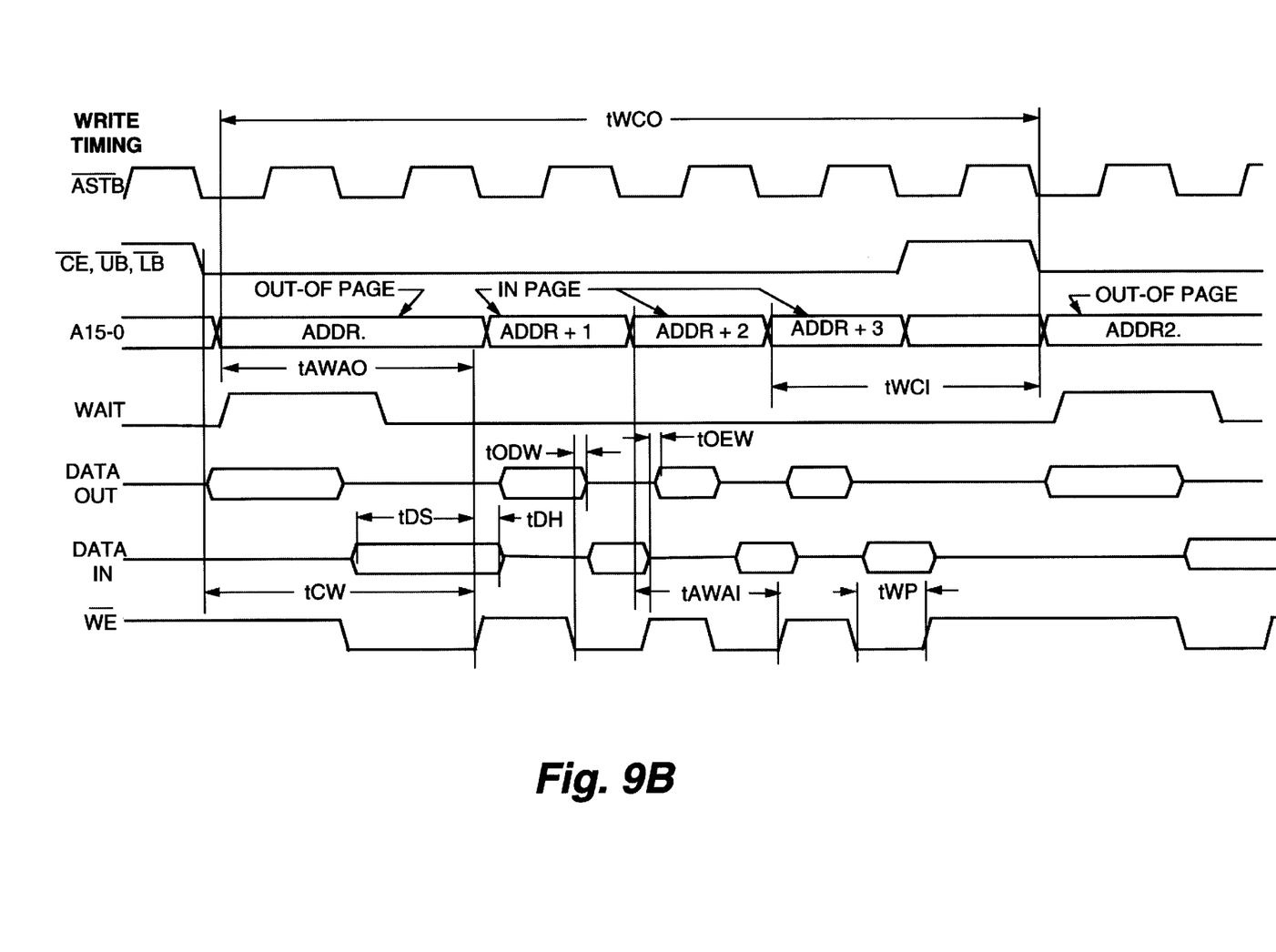
Figure 9C:
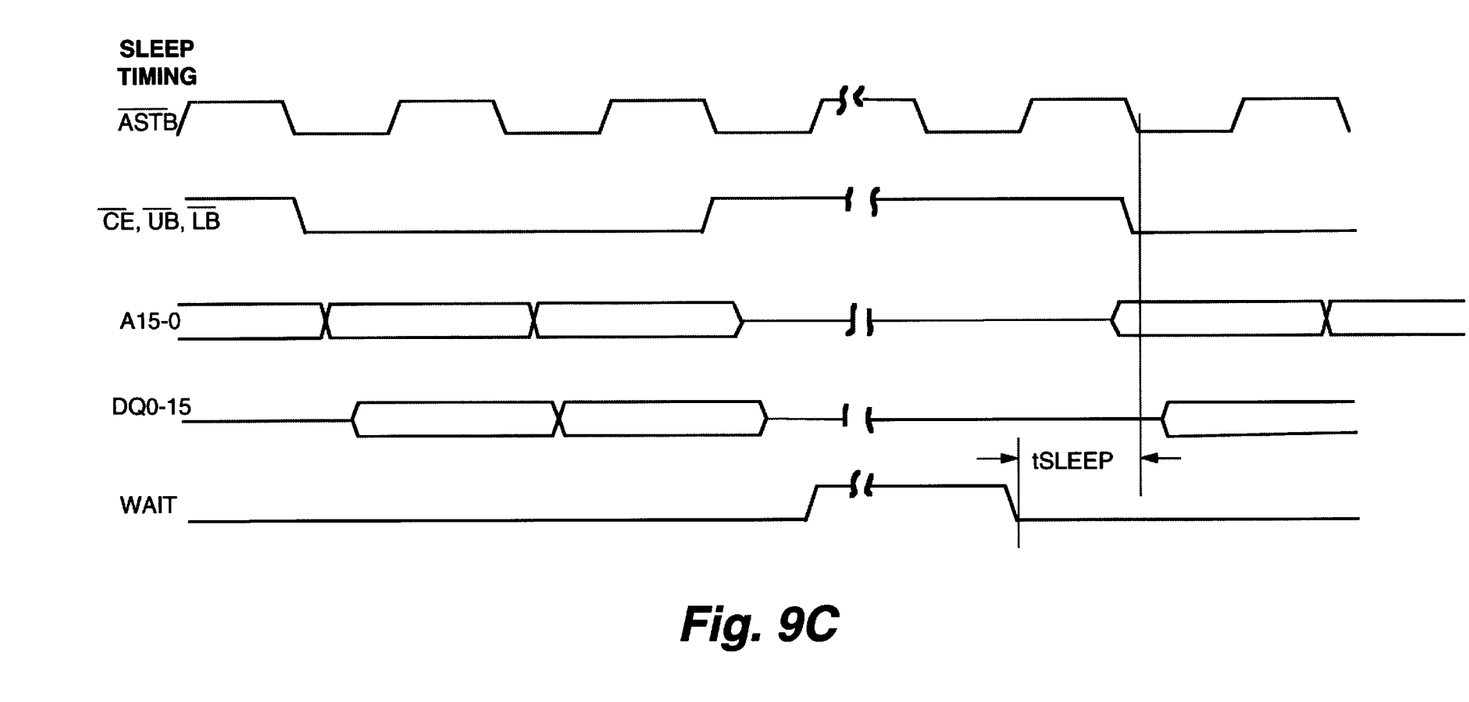

With reference additionally now to FIGS. 9A through 9C, the memory device 10 read timing (FIG. 9A), write timing (FIG. 9B) and sleep timing (FIG. 9C) is shown. The read timing of FIG. 9A illustrates the functional and timing interrelationship amongst the ASTB\ input 20; the CE\ input 24; UB\ and LB\ inputs 44, 46; the address bus 16; the data bus 36; OE\ input 32 and the wait output 30.

The write timing diagram of FIG. 9B illustrates the functional and timing interrelationship amongst the ASTB\ input 20; the CE\ input 24; the UB\ and LB\ inputs 44, 46; the address bus 16, the WE\ input 22 and data in and data out on the data bus 36. The sleep timing diagram of FIG. 9C illustrates the functional and timing interrelationship amongst the ASTB\ input 20; the CE\ input 24; the UB\ and LB\ inputs 44, 46; the address bus 16; the data bus 36 and the wait output 30.

What has been provided, therefore, is an enhanced digital signal processing random access memory device utilizing a highly density DRAM core memory array integrated with an SRAM cache and internal refresh control functionality which may be provided in an integrated circuit package which is pin-compatible with industry standard SRAM memory devices. The memory device provides a high speed memory access device of particular utility in conjunction with DSP processors with performance equivalent to that of SRAM memory devices but requiring a significantly small die size which allows for the provision of greater effective memory capacity per die area. The internal refresh functionality of the device provides for all refresh operations to the DRAM memory array to occur transparently to the device user and provides control signals alerting the associated controller when refresh operations are being performed.

While there have been described above the principles of the present invention in conjunction with a specific memory device architecture and functionality, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A refresh control technique for a memory device incorporating a DRAM memory array, comprising the steps of:

providing an external input to said memory device, said external input having a first state indicating an external access to said memory device and having a second state indicating no external access to said memory device;

sensing that said external input is in said second state;

periodically refreshing said memory array so long as said external input is in said second state;

delaying for a predetermined time period at least one type of access to said memory device during each of said steps of periodically refreshing said memory array;

generating a wait signal within said memory device during each of said steps of periodically refreshing said memory array;

asserting said wait signal on an external output of said memory device in response to each of said steps of delaying;

sensing that said external input is in said first state;

suspending said step of periodically refreshing said memory array so long as said external input is in said first state;

determining if a predetermined number of refresh operations have been suspended during said step of suspending; and performing a refresh operation to said memory array when said predetermined number of refresh operations have been suspended; and asserting said wait signal on said external output in response to said step of performing a refresh operation to said memory array when said predetermined number of refresh operations have been suspended.

2. The refresh control technique of claim 1 wherein said step of periodically refreshing is carried out by the steps of:

incrementing a refresh row address of said memory array;

refreshing a row of said memory array corresponding to said refresh row address; and decrementing a refresh delay counter.

3. The refresh control technique of claim 1 wherein said step of determining if a predetermined number of refresh operations have been suspended is carried out by the steps of:

initializing a refresh delay counter in response to sensing that said external input is in said first state; and incrementing said refresh delay counter so long as said external input is in said first state, until said refresh delay counter corresponds to said predetermined number of refresh operations.

4. The refresh control technique of claim 1 wherein said at least one type of access is an out-of-page access.

5. The refresh control technique of claim 1 wherein said predetermined number of suspended refresh operations is 128.

6. An integrated circuit memory device chip, comprising:

a dynamic random access memory array within said chip;

a static random access memory cache within said chip and coupled to said memory array for receiving a row of data therefrom;

a memory decoder within said chip and coupled to said memory array and said memory cache;

an input/output control circuit within said chip and coupled to said memory array and said memory cache;

an external address bus extending externally of said chip and coupled to said memory decoder for accessing said memory array and said memory cache;

a bi-directional external data bus extending externally of said chip and coupled to said input/output control circuit for receiving data to be written to said memory array or for providing data to be read from said memory cache at a location determined by said memory decoder;

an external address valid strobe pin extending externally of said chip and coupled to said memory decoder for receiving a signal indicating that an address signal on said external address bus is valid;

a wait-state generator within said chip and coupled to said memory decoder and providing an external wait signal in response to a refresh operation on said memory array, said external wait signal being connected to a wait state pin that extends externally of said chip;

a refresh control circuit within said chip and coupled to said wait state generator for generating said external wait signal in response to refresh operations on said memory array;

said periodic refresh control circuit performing periodic refresh operation so long as said input/output control circuit does not receive data to be written to said memory array and does not provide data read from said memory cache; and said refresh control circuit performing a refresh operation when said periodic refresh operations have been skipped for a predetermined number of periodic refresh operations, as a result of said input/output control circuit continually receiving data to be written to said memory array and data read from said memory cache for a period of time that is equal to a period of time for periodically refreshing said memory array said predetermined number of times.

7. The memory device chip of claim 6 further comprising:

an external chip enable input extending externally of said chip and coupled to said memory decoder for receiving a signal for activating said chip.

8. The memory device chip of claim 6 further comprising:

an external write enable input extending externally of said chip and coupled to said memory decoder for receiving a signal indicating that a concurrent memory cycle access is one of a write or read operation.

9. The memory device chip of claim 6 further comprising:

an external output enable input extending externally of said chip and coupled to said input/output control circuit for receiving a signal allowing said chip to drive said external data bus.

10. The memory device chip of claim 6 wherein said memory array comprises at least two memory array banks.

11. The memory device chip of claim 10 wherein said memory cache comprises at least two memory cache lines, each of said at least two memory cache lines being associated with each of said at least two memory array banks.

12. The memory device chip of claim 6 wherein said memory decoder comprises:

an address demultiplexer (60) coupled to said external address bus;

a column address latch (62) coupled between an output of said address demultiplexer and said memory cache; and a row address latch (64) coupled between an output of said address demultiplexer and said memory array.

13. The memory device chip of claim 12 wherein said memory decoder further comprises:

a row comparator (66) coupled to said row address latch for receiving an indication of a designated row address of data currently maintained in said row address latch; and at least one last row read register (70,72) coupled to said row comparator, for maintaining an indication of a previous row address of data currently maintained in said memory cache, said chip being operative to place data maintained in said memory cache on said data bus if said row comparator indicates a correspondence in said designated and previous row addresses and being operative to load data from said designated row address in said memory array to said memory cache if said row comparator indicates said designated and previous row address do not correspond.

14. The memory device chip of claim 10 wherein said chip is compatible with an industry standard SRAM integrated circuit device.

15. The memory device chip of claim 14 wherein said industry standard SRAM integrated circuit device is encapsulated in a 44 pin TSOP package.

16. The memory device chip of claim 14 wherein said industry standard SRAM integrated circuit device is encapsulated in a 44 pin SOJ package.

* * * * *